United States Patent
Yamashita

(10) Patent No.: US 6,835,289 B2
(45) Date of Patent: Dec. 28, 2004

(54) PARTICLE IMPLANTATION APPARATUS AND PARTICLE IMPLANTATION METHOD

(75) Inventor: Takatoshi Yamashita, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 29 days.

(21) Appl. No.: 10/375,072

(22) Filed: Feb. 28, 2003

(65) Prior Publication Data

US 2003/0164287 A1 Sep. 4, 2003

(30) Foreign Application Priority Data

Mar. 1, 2002 (JP) .................................. P.2002-056187

(51) Int. Cl.$^7$ ............................................. C23C 14/34
(52) U.S. Cl. ........................... 204/192.11; 204/298.04; 204/298.23; 204/298.29; 204/298.11
(58) Field of Search ................. 204/298.04, 298.11, 204/298.23, 298.29, 192.11

(56) References Cited

U.S. PATENT DOCUMENTS 5,308,461 A * 5/1994 Ahonen .................. 204/192.11
6,495,010 B2 * 12/2002 Sferlazzo ................ 204/298.27
2002/0134668 A1 * 9/2002 Wan et al. ............. 204/192.11

* cited by examiner

Primary Examiner—Steven Versteeg
(74) Attorney, Agent, or Firm—Finnegan, Henderson, Farabow, Garrett & Dunner, L.L.P.

(57) ABSTRACT

The particle implantation apparatus comprises a target, an ion beam source, a target scanning mechanism, a slit plate, a holder, and a holder scanning mechanism. The target is used for sputtering. The ion beam source applies an ion beam apparently like a sheet wider in the X direction onto the target so as to generate sputter particles. The target scanning mechanism mechanically scans the target in the Y direction crossing the X direction in reciprocating manner at a fixed angle with respect to the ion beam. The slit plate is used for passing sputter particles generated from the target and has a long slit extending in the X direction. The holder holds a substrate at the position where sputter particles having passed through the slit are incident. The holder scanning mechanism mechanically scans the holder in the Z direction crossing both the X and Y directions in reciprocating manner.

8 Claims, 2 Drawing Sheets

PARTICLE IMPLANTATION APPARATUS AND PARTICLE IMPLANTATION METHOD

BACKGROUND OF THE INVENTION

1. Field of the Invention

The present invention relates to a particle implantation apparatus and a particle implantation method for uniformly implanting a large amount of particles having low energy into a substrate by the sputtering method.

2. Description of the Related Art

In recent years, in a semiconductor device manufacturing field, there is a demand for a technique for uniformly implanting a large amount of particles having low energy into the substrate. For example, in manufacturing the semiconductor devices such as a field effect transistor (e.g., MOS-FET) by implanting impurities in the form of ions into the semiconductor substrate, implantation area becomes shallow as the scale of integration of such devices increases in recent years. Therefore, it is required to implant impurities having lower energy than before (e.g., in a range from several eV to hundreds eV, several keV at most).

However, if ions (ion beam) having low energy are extracted from an ion source, an ion beam current that can be extracted suddenly decreases, because the ion beam current decreases in proportion to the 3/2-th power of an extraction voltage (called a 3/2-th power proportion rule). In this case, it is difficult to implant a large amount of ions, so that the implantation treatment capability (through-put) abruptly decreases.

At present, a technique is employed in which an ion beam extracted from the ion source at fully higher energy than several keV is decelerated by a decelerator and transported at low energy of interest below several keV for implantation. However, in a case of transporting the ion beam having low energy below several keV, the ion beam is greatly diverged due to its space charge effect, resulting in an extremely low transport efficiency of the ion beam, especially when the ion beam having a low energy and a large current is transported. This is because when the ion beam has a large current, its space charge effect is large, and when the ion beam has a low energy, the ion beam is easily affected by the divergence due to space charge. Accordingly, with the above technique, it is difficult to implant a large amount of ions having low energy into the substrate.

SUMMARY OF THE INVENTION

It is an object of the present invention to provide a particle implantation apparatus and a particle implantation method that can uniformly implant a large amount of particles having low energy into the substrate.

In order to accomplish the objective above, the following means are adopted. According to the present invention, there is provided an apparatus for implanting particles onto a substrate comprising:

a target for sputtering;

an ion beam source for applying an ion beam apparently like a sheet wider in a X direction onto the target so as to generate sputter particles from the target by the sputtering;

a target scanning mechanism for mechanically scanning the target in a Y direction crossing the X direction in reciprocating manner at a fixed angle with respect to the ion beam;

a slit plate having a long slit extending in the X direction for passing the sputter particles generated from the target;

a holder for holding the substrate at a position where sputter particles having passed through the slit of the slit plate are incident; and a holder scanning mechanism for mechanically scanning the holder in a Z direction crossing both the X and Y directions in reciprocating manner.

The ion beam source generates the ion beam apparently like a sheet by scanning a spot-like ion beam electrically or magnetically in reciprocating manner, or may generate the ion beam actually like a sheet without scanning.

Since this particle implantation apparatus implants the ion beam from the ion beam source not to the substrate but to the target, the ion beam applied to the target may have a higher energy than several keV. If the ion beam having high energy is employed, it is possible to avoid the problems with an ion beam current reduction according to the 3/2-th power proportion rule and a lower transport efficiency due to space charge. Therefore, the ion beam can be applied by large amount (in large current) to the target. Further, the energy range of high sputtering rate can be utilized. As a result, a large amount of sputter particles can be produced by sputtering from the target. The "sputter particles" means particles flown out from the target by sputtering.

Though sputter particles produced by sputtering are composed of neutral particles and positive ions and etc., it is empirically known that the energy of sputter particles is distributed over a range from several eV to about 20 eV, irrespective of the energy of applied ion beam. With the above configuration, a large amount of sputter particles having low energy can be implanted into the substrate. Accordingly, the implantation treatment capability at low energy is enhanced.

Incidentally, in a well-known sputtering apparatus, two dimensional large area ion beam covering an almost entire area of a target is applied to the target, and sputter particles produced from the target are made incident directly on the substrate (e.g., refer to JP-A-4-314860).

On the contrary, in the present invention, the ion beam apparently like a sheet wider in the X direction can be applied from the ion beam source to the target, in which it is only necessary for the ion beam to be uniform in the X direction alone. Hence, the ion beam can be applied more uniformly than the two dimensional large area ion beam with a density distribution like a mountain which is usually dense in the central portion and sparse in the peripheral portion. In particular, the ion beam is easily scanned in the X direction. Accordingly, sputter particles are produced uniformly in the X direction from the target. Hence, the sputter particles can have more uniform density distribution and more aligned angle of incidence for sputter particles incident on the substrate than the sputter particles produced by applying the two dimensional large area ion beam. Since the holder scanning mechanism allows the substrate on the holder to be scanned in the Z direction crossing the X direction, and the sputter particles are produced uniformly in the X direction, the sputter particles can be uniformly incident on a wide area (e.g., almost entire area) of the substrate and uniformly implanted into the wide area of the substrate. Furthermore, a great number of sputter particles having low energy can be implanted as previously described.

Moreover, in the present invention, since sputter particles can be incident on the substrate through the slit extending long in the X direction of the slit plate, the angles of incidence for the sputter particles incident on the substrate can be aligned. Accordingly, the implantation characteristic can be enhanced.

Further, in the present invention, the target scanning mechanism is provided to mechanically scan the target in the Y direction, whereby a wide area of the target is utilized for sputtering. If the target is fixed, and the sputtering is made at the same location continuously, the target is locally cut to change the sputtering situations including the direction and amount of discharged sputter particles, whereby it is difficult to make the sputter particles uniformly incident on the substrate and uniformly implanted in a short time. However, this problem can be resolved by the scanning of the target. Accordingly, from this point of view, the implantation treatment capability at low energy can be also enhanced.

The particle implantation apparatus may further comprise an acceleration power source for applying a DC accelerating voltage having a positive target side between the target and the holder. In this manner, because positive ions contained in the sputter particles produced from the target are accelerated by the accelerating voltage and implanted into the substrate, it is possible to realize implantation (ion implantation) in a higher energy range than the intrinsic energy (several eV to about 20 eV as previously mentioned) of sputter particles.

The particle implantation apparatus may further comprise an energy filter between the target and the holder for selectively deriving positive ions having a specific energy. In this manner, the energy of positive ions implanted into the substrate is limited to a specific value. It is possible to prevent neutral particles in the sputter particles or the incident ions repelled against the target from being incident on the substrate. As a result, it is possible to realize the precise particle implantation (ion implantation) with the desired energy of implantation ions.

DETAILED DESCRIPTION OF THE INVENTION

Figure 1:
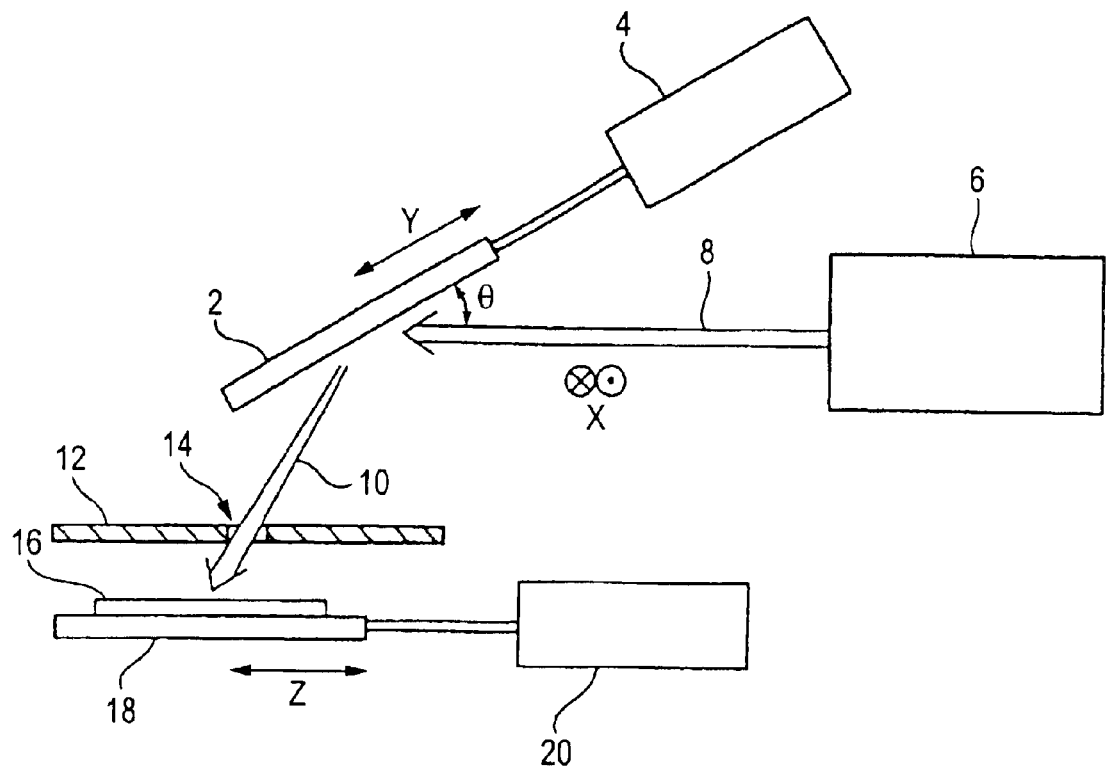
FIG. 1 is a schematic side view showing an embodiment of a particle implantation apparatus according to the present invention.
Figure 2:
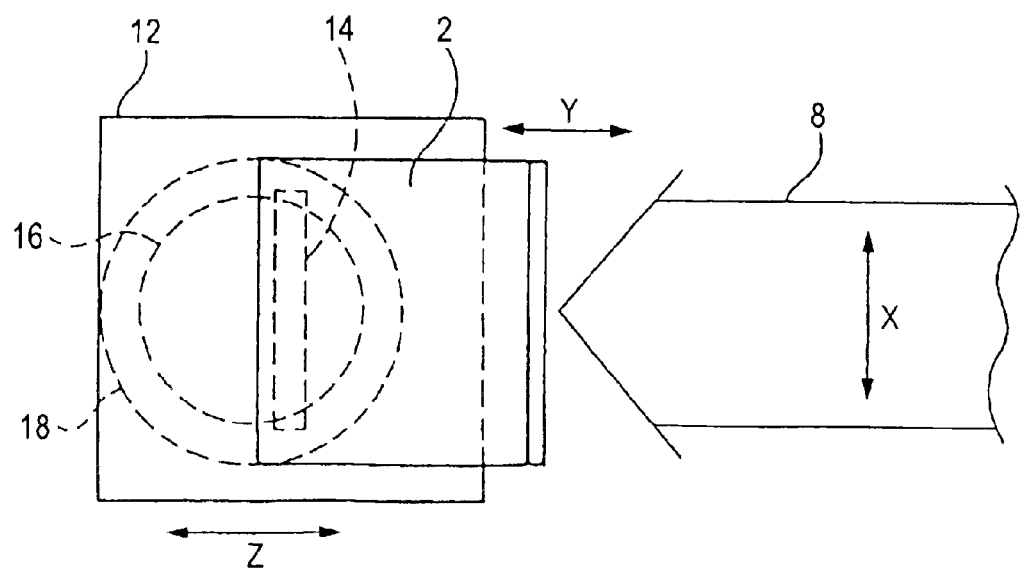
FIG. 2 is a plan view showing the surroundings of a target of FIG. 1.

FIG. 1 is a schematic side view showing an embodiment of a particle implantation apparatus according to the present invention. FIG. 2 is a plan view showing the surroundings of a target of FIG. 1.

The particle implantation apparatus comprises a plate-like target 2 for sputtering, and an ion beam source 6 for generating sputter particles 10 from the target 2 by applying an ion beam 8 apparently like a sheet wider in the X direction onto this target 2. The term "like a sheet wider in the X direction" as used herein means that the width in the X direction is fully wider than the thickness in a direction orthogonal to the X direction. Alternatively, it may have a slender sectional shape that extends longer in the X direction. The term "apparently" means that the ion beam 8 looks like a sheet by scanning a spot-like ion beam, or the ion beam 8 is actually like a sheet without scanning.

The target 2 has a dimension covering the width of the ion beam 8 in the X direction. This target 2 may be made of a material containing an element to be implanted into a substrate 16, but preferably a material composed of an element to be implanted, with higher purity. For example, when boron (B) is implanted into the substrate 16, the target 2 composed of pure boron is preferred.

The ion beam source 6 generates the ion beam 8 apparently like a sheet by scanning a spot-like ion beam extracted from an ion source in the X direction in reciprocating manner using an electric field or magnetic field with a scanner in this embodiment. Hence, it may generate the ion beam 8 actually like a sheet from the ion source. This ion beam source 6 also comprises an accelerator for accelerating the ion beam 8 output therefrom to desired energy in this embodiment.

The species or energy of the ion beam 8 applied to the target 2 is preferably one in which more sputter particles 10 are discharged at a higher sputtering rate of the target 2 by the ion beam 8 (sputtering rate=number of atoms to be sputtered by incidence of one ion, unit: atoms/ion). For example, the ion beam 8 may be an inert gas ion beam of Ar, He, Ne, Kr or Xe. If this inert gas ion beam is employed, there is an advantage that it is possible to prevent any useless reaction with the material constituting the target 2.

The energy of the ion beam is preferably selected to be a higher energy than several keV in view of easiness of generation from the ion beam source 6 in addition to the sputtering rate. Specifically, it may be selected in a range from about 10 keV to several hundreds of keV. However, since with too high energy, the sputtering rate is saturated and not increased, it may be preferably selected in a range from about 10 keV to about 100 keV. The ion beam 8 having an energy of this level is relatively easy to generate from the ion beam source 6 with a large current from about 10 mA to several tens of mA.

This particle implantation apparatus further comprises a target scanning mechanism 4 for mechanically scanning the target 2 in reciprocating manner at a fixed angle θ with respect to the ion beam 8 in the Y direction crossing the X direction at the angle θ. The angle θ is preferably selected to have a higher sputtering rate of the ion beam 8 to the target 2 to discharge more sputter particles 10. For example, the angle θ may be selected in a range from about 20° to 30°.

This particle implantation apparatus further comprises a slit plate 12, a holder 18, and a holder scanning mechanism 20. The slit plate 12 has a slit 14 extending longer in the X direction for passing sputter particles 10 generated from the target 2. The holder 18 holds a substrate 16 as the material to be processed at a position where sputter particles 10 passing through this slit 14 are incident. The holder scanning mechanism 20 mechanically scans this holder 18, together with the substrate 16, in reciprocating manner in the Z direction crossing both the X and Y directions. This Z direction is a direction extending orthogonal to the X direction and crossing the Y direction at the angle θ in this embodiment.

Since this particle implantation apparatus implants the ion beam 8 from the ion beam source 6 to the target 2 but not to the substrate 16, the ion beam 8 applied to the target 2 may have a higher energy than several keV, as previously mentioned. If the ion beam 8 having high energy is employed, it is possible to avoid the problems with an ion beam current reduction according to the 3/2-th power proportion rule and a lower transport efficiency due to space charge. Therefore, the ion beam 8 can be applied by large amount (in large current) to the target 2. Further, the energy range of high sputtering rate can be utilized. As a result, a large amount of sputter particles 10 can be produced by sputtering from the target 2. Since the sputtering rate of about 5 to 10 is easily realized, it is possible to produce sputter particles 10 by the amount many times larger than the amount of incident ion beam 8.

Though sputter particles 10 produced by sputtering are composed of neutral particles and positive ions, it is empirically known that the energy of sputter particles is distributed over a range from several eV to about 20 eV, irrespective of the energy of applied ion beam 8. In this particle implantation apparatus, sputter particles 10 having such a low energy can be made incident and implanted by large amount into the substrate 16. Particles can be implanted by much larger amount into the substrate than when the ion beam having the same amount of energy is transported and applied directly to the substrate 16. Particles implanted into the substrate 16 may be neutral particles or positive ions. Accordingly, the implantation treatment capability at low energy is enhanced.

With this particle implantation apparatus, the ion beam apparently like a sheet wider in the X direction can be applied from the ion beam source 6 to the target 2, in which it is only necessary for the ion beam 8 to be uniform in the X direction alone. Hence, the ion beam can be applied more uniformly than the two dimensional large area ion beam. In particular, when the ion beam 8 is scanned in the X direction, the ion beam of the same spot is reciprocated in the X direction, and thereby applied uniformly in the X direction. Accordingly, sputter particles 10 are produced uniformly in the X direction from the target 2. Since the holder scanning mechanism 2 allows the substrate 16 on the holder 18 to be scanned in the Z direction orthogonal to the X direction, and the sputter particles 10 are produced uniformly in the X direction, the sputter particles can be uniformly incident on a wide area (e.g., almost entire area) of the substrate 16 and uniformly implanted into the wide area of the substrate 16. Furthermore, a great number of sputter particles 10 having low energy can be implanted as previously described.

Moreover, since this particle implantation apparatus allows sputter particles 10 to be incident on the substrate 16 through the slit 14 extending long in the X direction of the slit plate 12, the angles of incidence for the sputter particles incident on the substrate 16 can be aligned. Accordingly, the implantation characteristic can be enhanced.

Sputter particles 10 passing through the slit 14 of the slit plate 12 are incident on a long and narrow area extending in the X direction of the substrate 16 and implanted, as seen in the plane, but can be incident on a wide area (e.g., almost entire area) of the substrate 16 and implanted uniformly by means of this slit plate 12, because the holder scanning mechanism 20 is provided to scan the holder 18 and the substrate 16 in the Z direction orthogonal to the X direction.

Further, with this particle implantation apparatus, the target scanning mechanism 4 is provided to mechanically scan the target 2 in the Y direction, whereby a wide area (e.g., almost entire area) of the target 2 is utilized for sputtering. If the target 2 is fixed, and the sputtering is made at the same location continuously, the target 2 is locally cut (bored) to change the sputtering situations including the direction and amount of discharged sputter particles 10. Therefore, it is difficult to make the sputter particles 10 uniformly incident on the substrate 16 and uniformly implanted in a short time. However, this problem can be resolved by the scanning of the target 2. Accordingly, from this point of view, the implantation treatment capability at low energy can be also enhanced.

Figure 3:
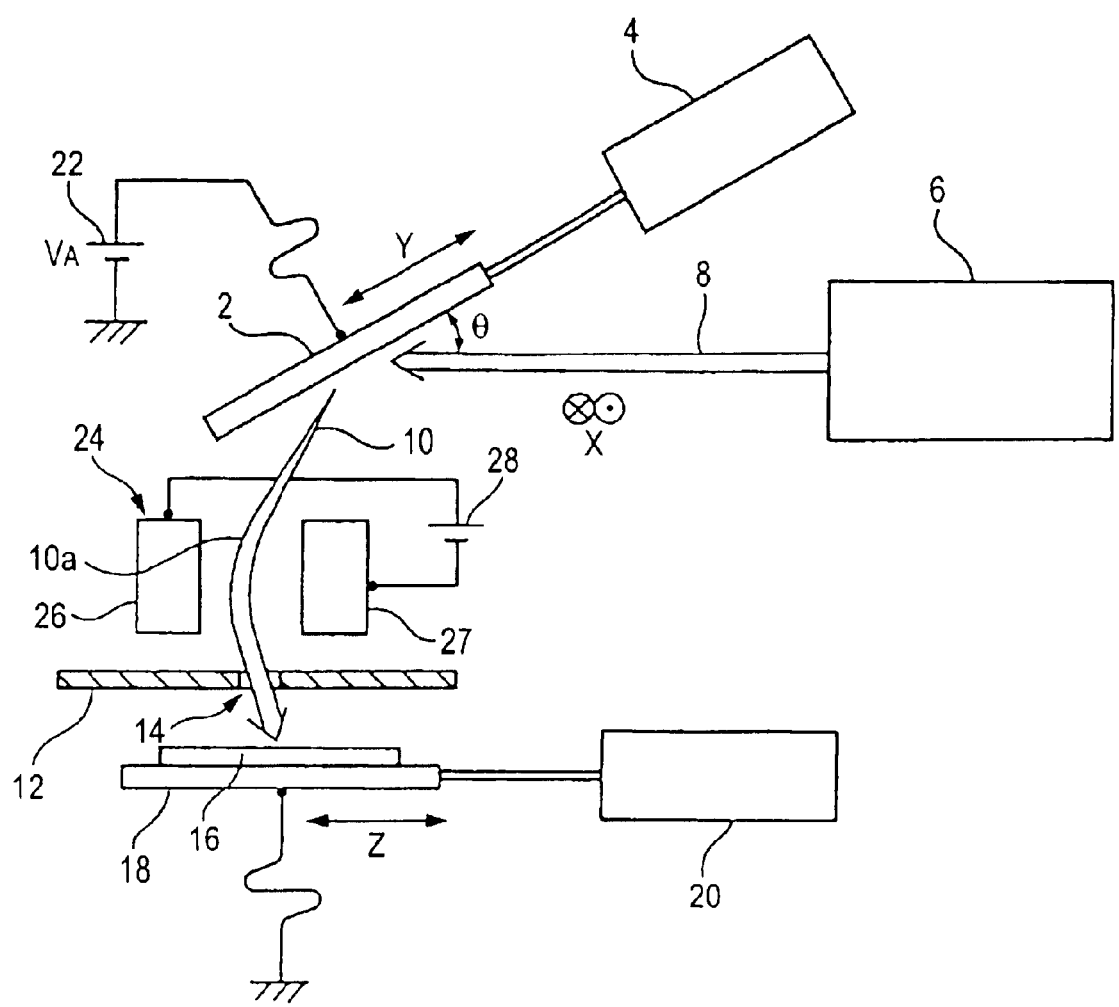
FIG. 3 is a schematic side view showing another embodiment of the particle implantation apparatus according to the present invention.

FIG. 3 is a schematic side view showing another embodiment of the particle implantation apparatus according to the present invention. This another embodiment will be described mainly about different points from the embodiments in FIGS. 1 and 2. This particle implantation apparatus comprises an acceleration power source 22 for applying a DC accelerating voltage $V_A$ between the target 2 and the holder 18 with a positive target 2. The holder 18 is grounded in this embodiment.

Because positive ions 10a contained in the sputter particles 10 are accelerated by this accelerating voltage $V_A$ and implanted into the substrate 16, it is possible to realize implantation (ion implantation) in a higher energy range than the intrinsic energy (several eV to about 20 eV as previously mentioned) of sputter particles 10. For example, positive ions 10a having an energy from 20 eV to several keV can be implanted into the substrate 16 in accordance with the accelerating voltage $V_A$. The particle implantation apparatus of FIG. 3, which implants positive ions 10a into the substrate 16, is also called an ion implantation apparatus.

The quantity of positive ions 10a contained in the sputter particles 10 is quite smaller than that of neutral particles, but a greater quantity of ions can be implanted into the substrate 16 than when the ion beam having an energy as low as the positive ions 10a is transported to the substrate 16, and applied directly to the substrate 16.

This particle implantation apparatus further comprises an energy filter 24 for selectively deriving the positive ions 10a having a specific energy (in other words, performing the energy separation) between the target 2 and the holder 18, or more specifically, between the target 2 and the slit plate 12 in this embodiment.

The energy filter 24 is a filter with electric field in this embodiment, and comprises two filter electrodes 26 and 27 opposed across the path of positive ions 10a and extending in the X direction, and a filter power source 28 for applying a DC voltage to them. Thereby, positive ions 10a having an energy corresponding to a voltage applied between two filter electrodes 26 and 27, or an electric field strength, can be selectively derived.

The energy filter 24 may selectively derive positive ions 10a having a specific energy using a magnetic field, instead of the above configuration. In this case, the magnetic field may be developed in a direction along the X direction.

The energy filter 24 allows the energy of positive ions 10a implanted into the substrate 16 to be limited to a specific value. It is possible to prevent neutral particles in the sputter particles 10 or the incident ions (ions in the ion beam 8) repelled against the target 2 from being incident on the substrate 16. As a result, it is possible to realize the precise particle implantation (ion implantation) with the desired energy of implantation ions.

A slit plate like the slit plate 12 may be provided at the entrance side of the energy filter 24. In this way, useless particles entering the energy filter 24 can be decreased, whereby there is the effect of preventing the contamination of the energy filter 24. If a single slit plate 12 is provided, it is preferably disposed between the energy filter 24 and the substrate 16, as shown in the embodiment of FIG. 3. This is because positive ions 10a emerging on undesired orbit from the energy filter 24 can be removed and prevented from being incident on the substrate 16.

Incidentally, in the case where positive ions 10a in the sputter particles 10 are implanted into the substrate 16 in the particle implantation apparatus as shown in FIG. 3, the ion beam 8 to be applied to the target 2 is preferably an ion beam of fluoride of materials that constitutes the target 2. For example, when the target 2 is composed of boron, $BF_2$ ion beam is preferred. If this ion beam 8 is employed, the percentage of positive ions 10a contained in the sputter particles 10 is greatly increased (e.g., by about one to two digits) due to the presence of fluorosis, as compared with when the inert gas ion beam such as Ar is employed, whereby the implantation treatment capability can be enhanced.

The particle implantation apparatus as shown in FIGS. 1 to 3, in particular the particle implantation apparatus as shown in FIG. 1, can implant a large amount of sputter particles 10 having low energy uniformly into the substrate 16. Therefore, sputter particles 10 can be deposited uniformly on the surface of the substrate 16 to form a thin film having even thickness.

What is claimed is:

1. An apparatus for implanting particles onto a substrate comprising:

a target for sputtering;

an ion beam source for applying an ion beam like a sheet wider in a X direction onto said target so as to generate sputter particles from said target by the sputtering;

a target scanning mechanism for mechanically scanning said target in a Y direction crossing said X direction in reciprocating manner at a fixed angle with respect to said ion beam;

a slit plate having a long slit extending in said X direction for passing the sputter particles generated from said target;

a holder for holding the substrate at a position where sputter particles having passed through the slit of said slit plate are incident; and a holder scanning mechanism for mechanically scanning said holder in a Z direction crossing both the X and Y directions in reciprocating manner.

2. The apparatus according to claim 1, further comprising:

an acceleration power source for applying a DC accelerating voltage having a positive target side between said target and said holder.

3. The apparatus according to claim 2, further comprising:

an energy filter for selectively deriving positive ions having a specific energy between said target and said holder.

4. The apparatus according to claim 1, further comprising:

an energy filter for selectively deriving positive ions having a specific energy between said target and said holder.

5. A method for implanting particles into a substrate held by a holder comprising:

applying an ion beam like a sheet wider in a X direction onto a target so as to generate sputter particles from said target by sputtering while mechanically scanning said target in a Y direction crossing said X direction in reciprocating manner at a fixed angle with respect to said ion beam;

aligning an angle of incidence to the substrate for the sputter particles generated from the target; and mechanically scanning said holder in a Z direction crossing both the X and Y directions in reciprocating manner in a state that said holder holds in the substrate at a position where the aligned sputter particles are incident.

6. The method according to claim 5, further comprising:

applying a Dc accelerating voltage having a positive target side between said target and said holder.

7. The method according to claim 6, further comprising:

selectively deriving positive ions having a specific energy between said target and said holder.

8. The method according to claim 5, further comprising:

selectively deriving positive ions having a specific energy between said target and said holder.

* * * * *